United States Patent
Rumbolz et al.

(10) Patent No.: US 10,312,664 B2
(45) Date of Patent: Jun. 4, 2019

(54) METHOD FOR PATTERNING A SEQUENCE OF LAYERS AND SEMICONDUCTOR LASER DEVICE

(71) Applicant: OSRAM Opto Semiconductors GmbH, Regensburg (DE)

(72) Inventors: Christian Rumbolz, Lappersdorf (DE); Sven Gerhard, Alteglofsheim (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 15/517,144

(22) PCT Filed: Sep. 21, 2015

(86) PCT No.: PCT/EP2015/071610
§ 371 (c)(1),
(2) Date: Apr. 5, 2017

(87) PCT Pub. No.: WO2016/062477
PCT Pub. Date: Apr. 28, 2016

(65) Prior Publication Data
US 2017/0302058 A1    Oct. 19, 2017

(30) Foreign Application Priority Data
Oct. 20, 2014  (DE) ........................ 10 2014 115 253

(51) Int. Cl.
*H01S 5/00* (2006.01)
*H01S 5/20* (2006.01)
(Continued)

(52) U.S. Cl.
CPC ...... *H01S 5/2081* (2013.01); *H01L 21/76232* (2013.01); *H01S 5/0224* (2013.01); *H01S 5/22* (2013.01); *H01S 5/2202* (2013.01)

(58) Field of Classification Search
CPC ........ H01S 5/2081; H01S 5/0224; H01S 5/22; H01S 5/24; H01S 5/0201; H01S 5/0203;
(Continued)

(56) References Cited

U.S. PATENT DOCUMENTS 4,546,538 A * 10/1985 Suzuki .................. H01L 21/033
148/DIG. 117
5,048,039 A *  9/1991 Tsubota ................ H01S 5/1228
372/45.013

(Continued)

FOREIGN PATENT DOCUMENTS

CN    103875059 A    6/2014
CN    103918142 A    7/2014
(Continued)

OTHER PUBLICATIONS

JPH0837338 English Translation.*
(Continued)

*Primary Examiner* — Jessica S Manno
*Assistant Examiner* — Delma R Fordé
(74) *Attorney, Agent, or Firm* — Slater Matsil, LLP

(57) ABSTRACT

A method for patterning a sequence of layers and a semiconductor laser device are disclosed. In an embodiment the method creates at least one trench in the sequence of layers by two plasma etching methods. The semiconductor laser device comprises a sequence of layers including a semiconductor material and two trenches in the sequence of layers. The trenches laterally delimit a ridge waveguide. Each of the trenches is delimited on the side facing away from the ridge waveguide by a region of the sequence of layers.

12 Claims, 6 Drawing Sheets

(51) Int. Cl.
*H01S 5/22* (2006.01)
*H01L 21/762* (2006.01)
*H01S 5/022* (2006.01)

(58) Field of Classification Search
CPC .... H01S 5/2086; H01S 5/2275; H01S 5/2272; H01S 5/2202; H01L 21/02252; H01L 21/3065
See application file for complete search history.

(56) References Cited

U.S. PATENT DOCUMENTS

| | | | |
|---|---|---|---|
| 5,624,529 A | 4/1997 | Shul et al. | |
| 5,667,630 A * | 9/1997 | Lo | H01L 21/32136 216/67 |
| 5,807,789 A * | 9/1998 | Chen | H01L 21/3065 257/E21.218 |
| 5,935,876 A | 8/1999 | Lee et al. | |
| 6,360,048 B1 * | 3/2002 | Yamada | G02F 1/025 372/50.1 |
| 6,797,610 B1 * | 9/2004 | Gambino | H01L 21/76802 257/E21.577 |
| 7,611,916 B2 * | 11/2009 | Kusunoki | B82Y 20/00 257/98 |
| 9,124,072 B2 | 9/2015 | Eichler et al. | |
| 9,293,640 B2 | 3/2016 | Hertkorn et al. | |
| 9,608,401 B2 | 3/2017 | Enzmann et al. | |
| 2004/0113164 A1 * | 6/2004 | Corbet | H01S 5/22 257/95 |
| 2005/0103748 A1 * | 5/2005 | Yamaguchi | H01L 21/31116 216/67 |
| 2005/0117251 A1 * | 6/2005 | Matono | G11B 5/3116 360/125.12 |
| 2005/0150863 A1 * | 7/2005 | Katsunuma | H01L 21/31116 216/41 |
| 2006/0063348 A1 | 3/2006 | Chen et al. | |
| 2008/0036044 A1 * | 2/2008 | Sakuma | H01S 5/0425 257/622 |
| 2010/0196806 A1 * | 8/2010 | Bucchignano | H01L 21/31144 430/5 |
| 2010/0220760 A1 | 9/2010 | Miyoshi et al. | |
| 2011/0075693 A1 | 3/2011 | Kuramochi et al. | |
| 2012/0309123 A1 * | 12/2012 | Tsuji | H01S 5/2201 438/39 |
| 2013/0001588 A1 * | 1/2013 | Fukuda | H01L 33/20 257/76 |
| 2013/0240023 A1 | 9/2013 | Sewell et al. | |
| 2013/0313567 A1 * | 11/2013 | Furuya | C30B 29/406 257/76 |
| 2014/0021160 A1 * | 1/2014 | Kitamura | B29D 11/00673 216/2 |
| 2015/0214109 A1 * | 7/2015 | Lei | H01L 21/78 438/462 |
| 2016/0104819 A1 * | 4/2016 | Schmid | H01L 33/0079 438/26 |
| 2016/0315446 A1 | 10/2016 | Taeger et al. | |
| 2018/0040512 A1 * | 2/2018 | Eberhard | H01L 21/76898 |

FOREIGN PATENT DOCUMENTS

| | | | |
|---|---|---|---|
| CN | 104508840 A | | 4/2015 |
| CN | 104871378 A | | 8/2015 |
| CN | 105830291 A | | 8/2016 |
| DE | 19640420 A1 | | 4/1998 |
| DE | 102012107921 | * | 3/2018 |
| JP | 837338 A | | 2/1996 |
| JP | 110325964 A | | 12/1998 |
| JP | 2000252062 A | | 9/2000 |

OTHER PUBLICATIONS

Prof. Tianhong Cui, Mechanical Engineering "Dry Etching" pp. 1-42.*

Olaf Kruger et al. "UV laser processing for semiconductor device" Laser Technik Journal May 2013 pp. 1-5.*

* cited by examiner

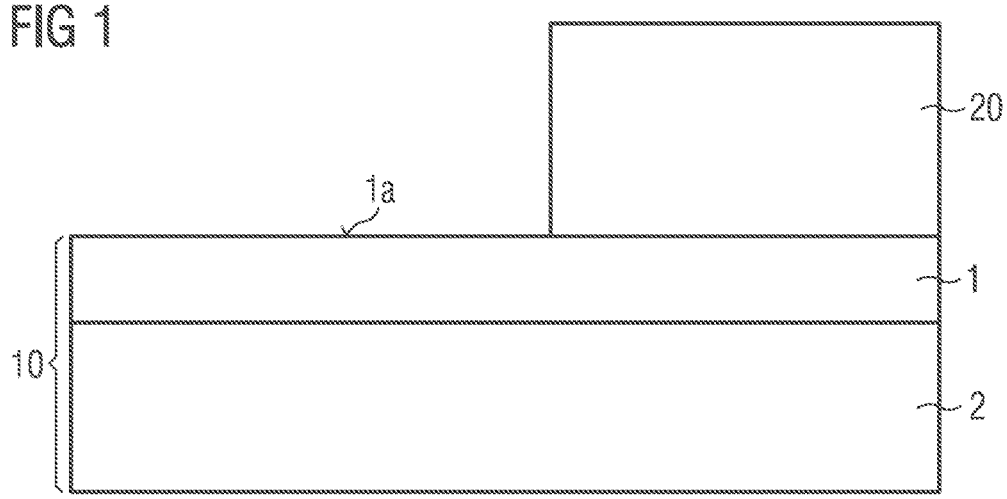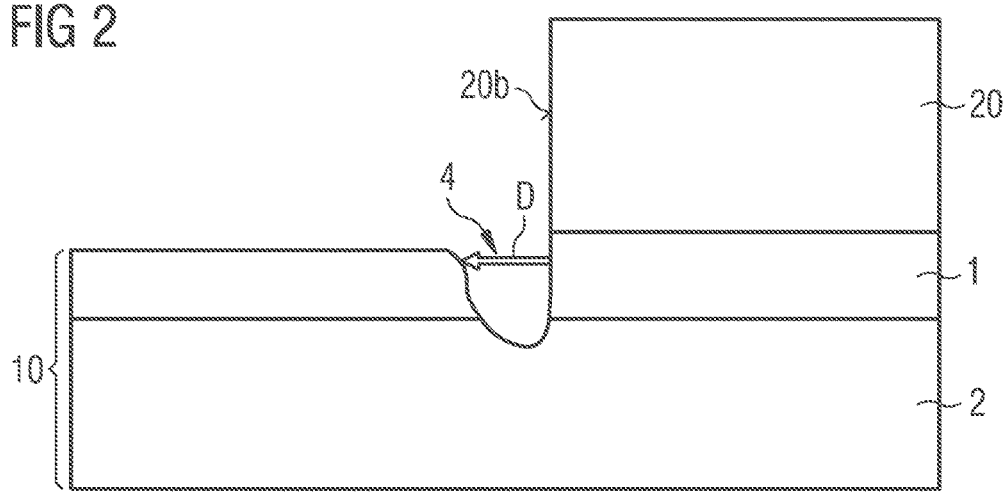

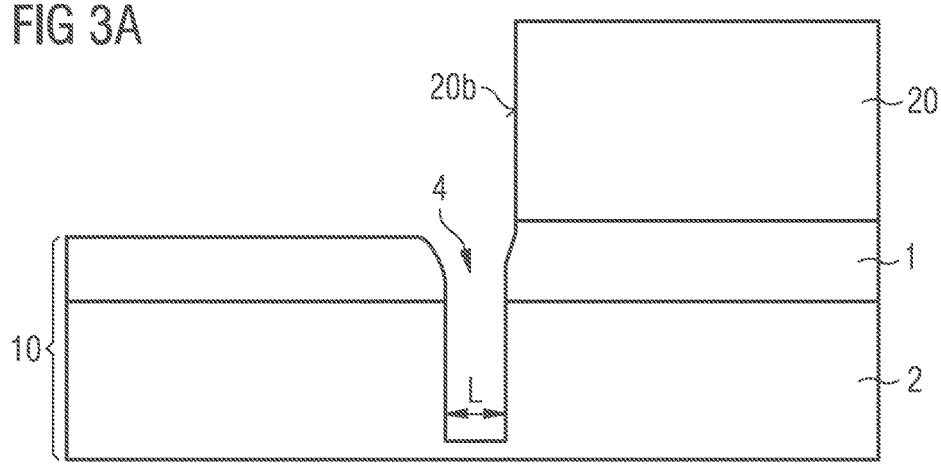
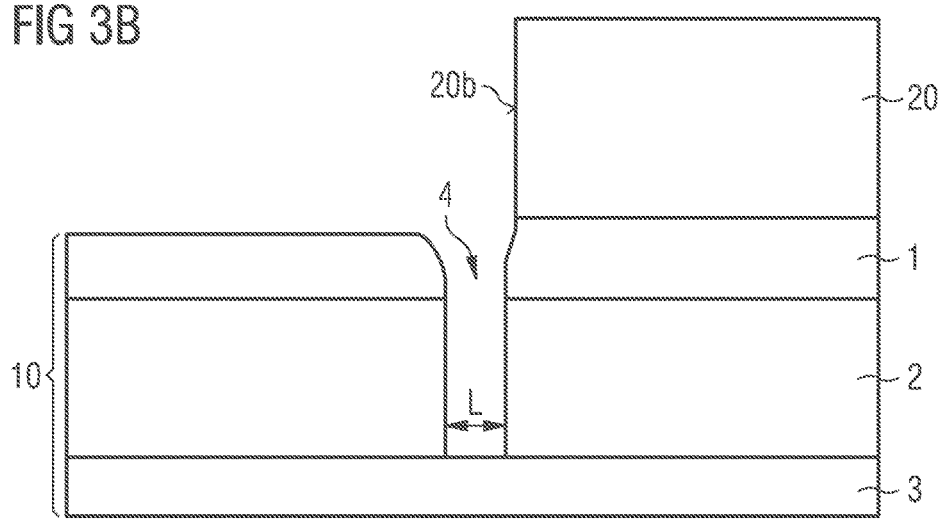

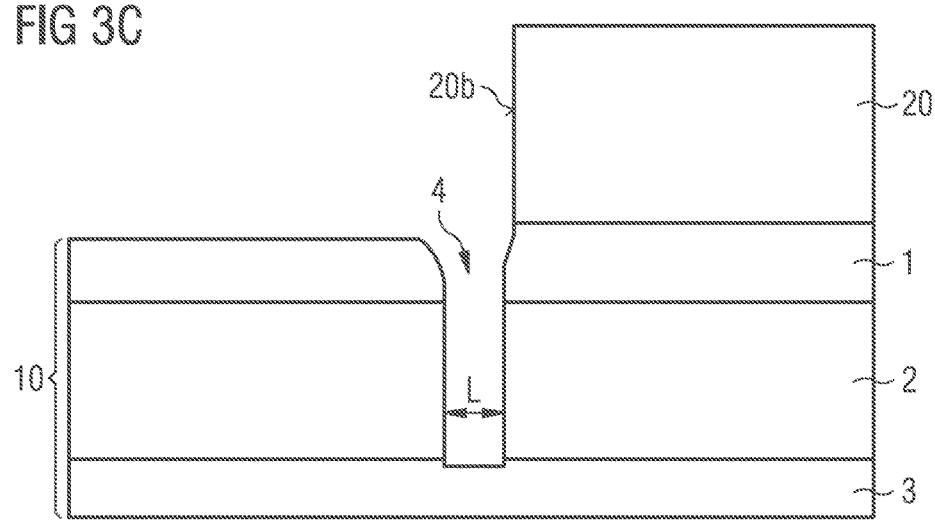

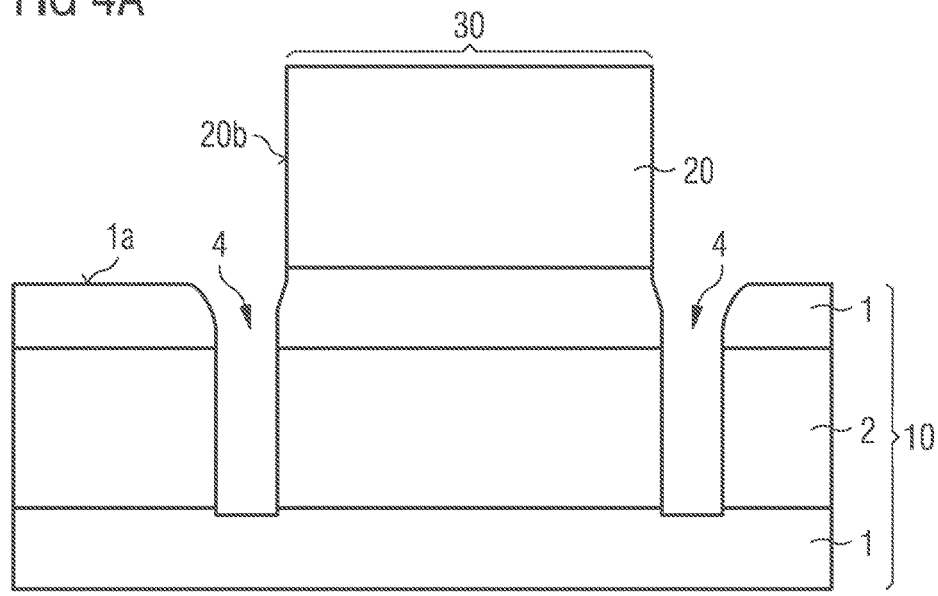
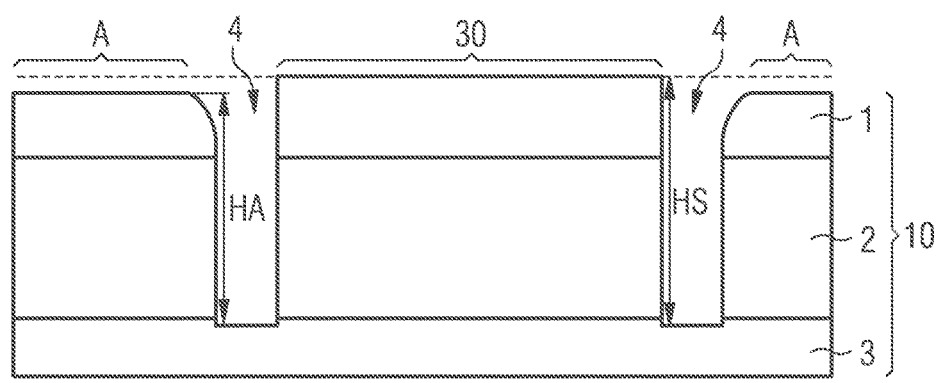

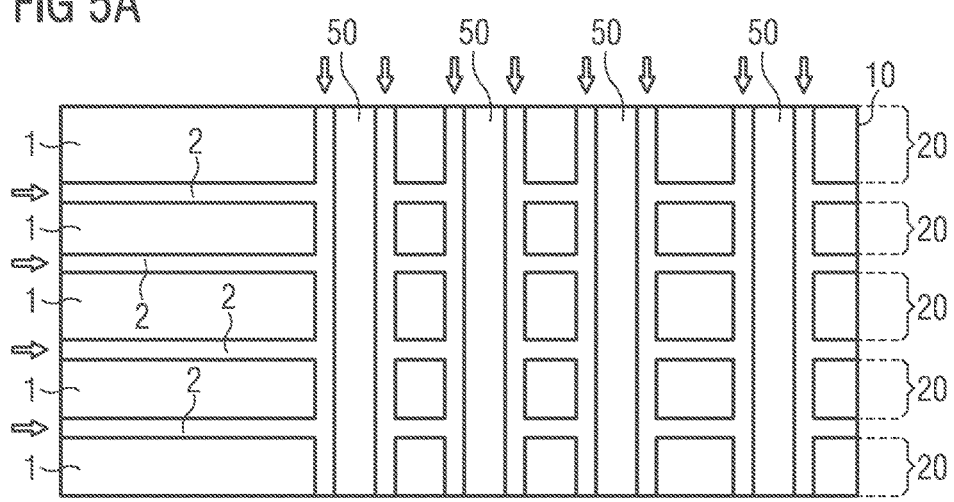
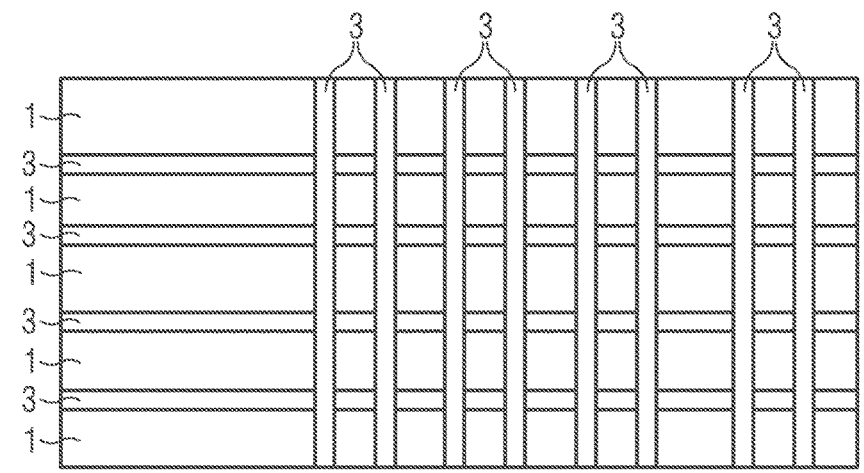

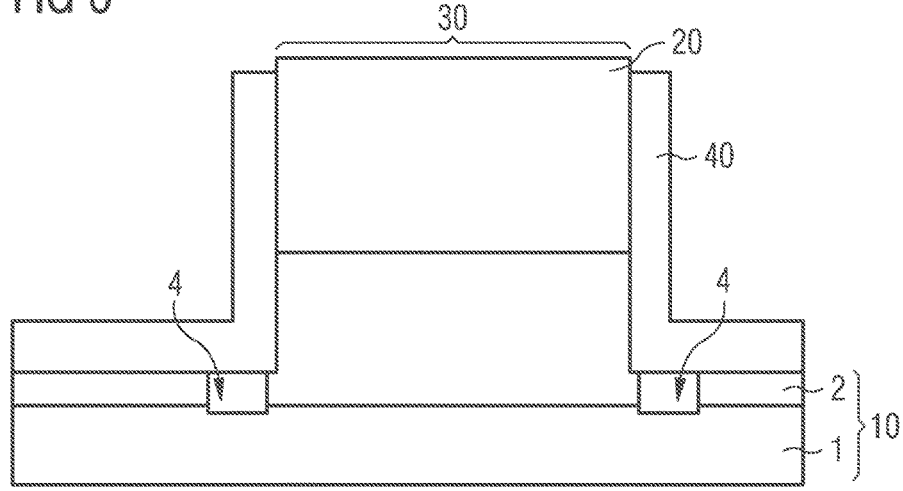

METHOD FOR PATTERNING A SEQUENCE OF LAYERS AND SEMICONDUCTOR LASER DEVICE

This patent application is a national phase filing under section 371 of PCT/EP2015/071610, filed Sep. 21, 2015, which claims the priority of German patent application 10 2014 115 253.0, filed Oct. 20, 2014, each of which is incorporated herein by reference in its entirety.

TECHNICAL FIELD

A method for patterning a sequence of layers and a semiconductor laser device are provided.

BACKGROUND

The document DE 19640420 A1 describes a method for producing a semiconductor laser device and a semiconductor laser device.

SUMMARY OF THE INVENTION

Embodiments provide a method that can be carried out particularly cost-efficiently. Further embodiments an improved semiconductor laser device.

According to at least one embodiment of the method for patterning a sequence of layers, the method comprises a method step in which the sequence of layers is provided, wherein the sequence of layers comprises at least one first layer and at least one second layer, which differ from one another in terms of their material composition. The first and second layers here are arranged one on top of another in a stacking direction of the sequence of layers. For example, the first layer covers the second layer completely on the upper side thereof. The first layer and second layer can each, for example, be layers that are formed using a semiconductor material, wherein the semiconductor materials of the two layers differ from one another at least in their composition. For example, both layers are produced epitaxially. In general, the two layers can be selected, for example, from the following classes of materials: semiconductor material, plastics material such as, e.g., lacquer, metal, dielectric materials such as, e.g., semiconductor oxides, semiconductor nitrides, metal oxides, and metal nitrides. The first and second layers here can be selected from the same class of materials or the first and second layers are selected from different classes of materials.

According to at least one embodiment of the method, the method comprises a method step in which a mask is applied on the top surface of the first layer facing away from the second layer. In other words, the first layer is an external layer of the sequence of layers, which outwardly delimits the sequence of layers on its upper side. A mask having at least one opening, in which the top surface of the first layer is exposed, is applied on the top surface of the first layer facing away from the second layer. The mask can be an etching mask, for example. The material for the mask can be selected from at least one of the following classes of materials: semiconductor material, plastics material such as, e.g., lacquer, metals such as chromium, titanium or aluminum, dielectric materials such as silicon oxide, in particular $SiO_2$, silicon nitride, in particular SiN, oxide such as $Al_2O_3$, ZnO, ITO.

The mask serves here in particular as an etching mask for a later dry etching process. It is possible here that the material is removed less strongly during subsequent etching steps than the material of the first layer, which is covered by the mask. In other words, the mask then has a lower etch rate than the first layer for subsequent etching processes.

According to at least one embodiment, the method comprises a method step in which the first layer is partially removed in an area of the sequence of layers not covered by the mask, wherein a partial exposure of the second layer is affected. This method step is affected in particular by a plasma etching method, such as, e.g., a chemical dry etching (CDE) method or a reactive ion etching (RIE) method.

During this first plasma etching method, the first layer is at least partially removed and in places an opening is created in the first layer, which opening completely penetrates the first layer so that on the bottom surface of the opening the second layer is exposed in places. The first layer is not completely removed, however, but remains present at least in parts. For example, apart from the location of the opening of the first layer or of the openings of the first layer, a thickness of the first layer is reduced by partial removal during the plasma etching method.

In other words, during the first plasma etching method, the first layer is partially removed and by the same plasma etching method—and not, for instance, in a further etching step—the second layer can be exposed. It is possible here that material from the second layer is also eroded or removed to a small extent and in places during the first plasma etching method.

According to at least one embodiment of the method, the method comprises a method step in which at least partial removal of the exposed second layer is effected by a second plasma etching method, which differs from the first plasma etching method. It is possible here that the second layer is partially or completely removed, for example, in the area of the opening of the first layer. The second plasma etching method is again, e.g., a chemical dry etching (CDE) method or a reactive ion etching (RIE) method.

According to at least one embodiment of the method, the first layer is removed more strongly by the first plasma etching method with diminishing distance in a direction lateral to the mask. The lateral directions here are those directions that run parallel to the top surface of the first layer within the limits of manufacturing tolerance, and which therefore run perpendicular to the stacking direction of the sequence of layers. In other words, areas of the first layer are etched more strongly in the first plasma etching method, and are therefore removed more strongly, the closer they are to the mask in the lateral direction. The removal is effected most strongly directly at the lateral surface of the mask. In this way, it is possible that, at the lateral surface of the mask, at least one trench is created in the sequence of layers, which trench extends completely through the first layer toward the second layer. In other areas, the first sequence of layers can experience only a reduction in thickness without being completely removed there. In other words, the first layer covers the second layer in other areas and the second layer is not exposed.

According to at least one embodiment of the method, the first layer is removed at a lower etch rate than the second layer during the second plasma etching method. In particular, the etch rate at which the first layer is etched during the second plasma etching method is low compared with the etch rate of the second layer during the second plasma etching method. In this way, it is possible that the second layer is etched only in the area of the opening of the sequence of layers, where the first layer is penetrated completely by the first plasma etching method. In this way, the trench is further deepened through the second layer in the vicinity of the mask. The trench in the vicinity of the mask therefore acts as a seed for further etching of the second layer of the sequence of layers.

Overall, a trench can be created in this way in the sequence of layers, which trench extends completely through the first layer and at least partially through or into the second layer. The trench is in the direct vicinity of the mask. The sequence of layers can thus comprise a defined opening at the edge of the mask, which opening extends through the first layer into the second layer or even through the second layer.

According to at least one embodiment of the method for patterning a sequence of layers, the method comprises the following steps:

providing the sequence of layers, comprising a first layer and a second layer, which differ from one another in terms of their material composition, applying a mask on the top surface of the first layer facing away from the second layer, partially eroding the first layer in an area of the sequence of layers not covered by the mask and partially exposing the second layer by a first plasma etching method, at least partially removing the exposed second layer by a second plasma etching method, wherein the first layer is removed more strongly by the first plasma etching method with diminishing distance in a direction lateral to the mask, the first layer is removed at a lower etch rate than the second layer during the second plasma etching method, at least one trench is created in the sequence of layers, which trench extends completely through the first layer and at least partially through the second layer.

It is possible in particular that the method described here is performed in the order described here, wherein further method steps may be present between the aforementioned method steps.

In the method described here, it has surprisingly been shown that very narrow etched trenches can be created thereby, which are below typical resolution limits of photolithography.

For the production of etched trenches, it is possible to use etching masks that are produced by photolithography. In this case, for example, a photoresist is illuminated with a shadow mask or a scanning light beam and then chemically developed, whereby the patterns of the shadow mask are transferred into the photoresist or a raster pattern of the illuminating light beam is replicated in the photoresist. The remaining photoresist then acts as a mask for the etching process and protects the parts of the underlying material from removal by etching.

One limitation of this method is the optical resolution, i.e., the accuracy with which the shadow mask can be replicated in the photoresist or the accuracy with which the illuminating light beam can write the desired pattern in the photoresist. In the limiting case, this method is limited by Abbe's diffraction criterion for the wavelength used. At the typically used wavelength in the UV range, in particular a wavelength of between 300 nm and 400 nm, this resolution limit theoretically lies within this range of magnitude. In fact, the resolution is additionally limited by the technical limits of the illuminating unit, which scarcely allows replication with accuracies lower than 1 μm.

The method described here is now based on a novel, combined plasma etching process in which the trench can be produced, which is not bound to the resolution limit of photolithography for the etching mask. With the methods described here, it is possible to etch narrow and deep trenches at the lateral surfaces of the mask, which are formed, e.g., by steep sidewalls of the mask, by means of chemical dry etching, which trenches can be adjusted within a broad range in terms of their depth and width and are not dependent on the width of the opening in the mask. The mask in this case can be formed, e.g., using material from at least one of the above-mentioned classes of materials.

The basis of the method described here is the targeted exploitation and control of etched trench formation ("trenching") during the first plasma etching method and the subsequent second plasma etching method which removes the second layer at a higher etch rate than the first layer, i.e., exhibits selectivity. It should be observed here that trenching, which can occur in the area around steep sidewalls during a plasma etching method, is normally an undesirable effect which is always avoided in conventional methods. Surprisingly, however, it has been shown that, by suitable choice of the etching parameters and the geometry of the mask, the trench can be created in a targeted manner and controlled in terms of its depth and lateral extent.

In other words, in the methods described here, targeted use is made of the actually undesirable trenching. Thus, for example, in the first plasma etching method the method is selected such that no selectivity or almost no selectivity occurs between the first layer and the second layer. In this way, in the vicinity of the mask, i.e., for example, at the vertical lateral surface of the mask perpendicular to the lateral directions, the first layer is removed locally down into the second layer. The width and depth of the trench can be adjusted here, for example, via the gas composition, process pressure, temperature and/or RF power output during the first plasma etching method. Alternatively or in addition, it is also possible to adjust the dimensions of the trench that is created via the thickness and composition of the first layer and/or the thickness and composition of the mask.

In the second plasma etching method, which has a significantly higher etch rate in the second layer than in the first layer, the previously created trench in the first layer is then etched to the desired depth. The etch depth here can be controlled via the selectivity of the second plasma etching method to a further third layer, via time or via an endpoint detection, which detects the transition from the second to the third layer. Because of the etching selectivity between the first and second layers, during the second plasma etching method the first layer is removed only very little or not at all. It is therefore possible that the first layer has a somewhat lower thickness in the area in which the mask is not present than in the area where the mask was present during the first plasma etching method and the second plasma etching method. This and the characteristic shape of the edges of the trench that is created allow clear evidence of the method described here in the final product.

Furthermore, it is advantageously possible in the method described here that the first layer is removed after completion of the method. In other words, the first layer does not have to be a layer that is necessary for the method, but it may serve only for the creation of the trench and may be removed again after completion of the method. According to at least one embodiment of the method, the first layer and the second layer are removed during the first plasma etching method at substantially the same etch rates. In other words, the first plasma etching method is executed such that the etching method has the lowest possible, and in particular no, selectivity between the first layer and the second layer.

It has been shown here that in this way, an opening in the first layer can be created particularly efficiently in the immediate vicinity of the mask, which opening acts as a starting point for a well-defined trench, which is completed during the second plasma etching method. In particular, it is also possible with this method to create multiple trenches in the sequence of layers. Thus, for example, the mask can extend along a line on the sequence of layers. If the plasma etching methods described are executed uniformly on the entire sequence of layers, trenches develop, for example, on all lateral surfaces of the mask that run transverse or perpendicular to the lateral directions, i.e., for example, to the top surface of the first layer.

According to at least one embodiment of the method, the at least one trench directly borders the mask laterally. In other words, there is no material from the first layer between the trench and the mask but the first layer is completely removed in the area bordering the mask. By means of the shaping of the lateral surfaces of the mask, which run transverse or perpendicular to the lateral directions, the shape of the bordering lateral surface of the trench can then be defined. For example, the trench can then follow a curved or straight course of the mask correspondingly.

Furthermore, it is possible that the mask comprises a plurality of openings, and trenches are formed in each opening in the direct vicinity of the mask. The trenches in this case have a smaller extent in the direction perpendicular to the lateral surface of the mask than the extent of the opening in the mask in the same direction.

According to at least one embodiment of the method, a lateral extent of the at least one trench perpendicular or transverse to a lateral surface of the mask facing the trench is small compared with a lateral extent of an opening in the mask. In other words, the width of the created trench is independent of the width of the mask opening, so that the limitations imposed, e.g., by the resolution limit of photolithography do not affect the width of the trench.

According to at least one embodiment of the method, the lateral extent of the at least one trench is less than 800 nm, in particular less than 100 nm. Using the described method, lateral recesses up to at least 25 nm can be achieved. Thus, the sizes of the lateral extents that can be achieved lie far below the resolution limit of known photolithographic methods.

According to at least one embodiment of the method, the sequence of layers comprises a third layer, which is arranged on the side of the second layer facing away from the first layer, wherein the second layer and the third layer differ from one another in terms of their material composition. In this case, it is further possible for the material compositions of the first layer and of the third layer to differ from one another or for these two layers to have the same material composition. The materials for the first, for the second and for the third layer can be selected from the above-mentioned classes of materials.

The third layer can, for example, determine the depth of the trench. Thus, it is possible for the depth of the trench, i.e., the etch depth, to be determined via the selectivity of the second plasma etching method. For example, the second plasma etching method can have a selectivity with respect to the third layer identical or similar to that with respect to the first layer. The etching process therefore stops at the third layer. Furthermore, it is possible that the etch depth is controlled via an endpoint detection, which detects the transition between the second and third layers.

In particular, it is also possible that the layers described here are in turn sequences of layers, which comprise two or more sublayers. These sublayers can then be integrated into the layers, wherein the selectivity of the plasma etching method described here with respect to the sublayers is selected such that sublayers with identical or similar selectivity of the plasma etching method are integrated into a layer.

According to at least one embodiment of the method, the at least one trench extends directly at or into or through the third layer. The trench can in particular extend through the third layer if the trench depth is determined by the etching time, i.e., the time for which the second plasma etching method is performed. For particularly long etching times, the trench can then also extend through the third layer. On the side of the third layer facing away from the second layer, further layers can be present through which or into which the trench can at least partially extend.

According to at least one embodiment of the method, the sequence of layers is formed using semiconductor material. In other words, at least one layer of the sequence of layers, for example, the second layer, is a semiconductor layer. Furthermore, it is possible that all the layers of the sequence of layers are then formed using a semiconductor material. In this embodiment of the method, the mask can cover a ridge waveguide and one of the trenches is created on each opposite side of the mask such that the trenches laterally delimit the ridge waveguide. The trenches can then extend, e.g., along the mask which covers the ridge waveguide, so that the ridge waveguide is delimited on both sides by the trenches.

It has been shown that a method as described here is suitable in particular for producing semiconductor lasers with a ridge waveguide. For example, they can be semiconductor lasers with ridge waveguides having a so-called three-legged structure. In such a three-legged structure, as along with the ridge waveguide, further step structures are created, in particular from the material of the sequence of layers, but these are electrically insulated from the contact with which the ridge waveguide is contacted—e.g., from the p-contact—and thus no current flows through them during operation.

The advantage of such a structure consists inter alia in the fact that, when the semiconductor laser is assembled, e.g., with its p-side downwards, the semiconductor laser can lie flat against a heat sink in the area of the ridge waveguide and the ridge waveguide is mechanically supported by the two neighboring structures. The assembly with the p-side downwards, i.e., such that the p-side of the semiconductor laser can be in direct contact with a heat sink, is advantageous for effectively dissipating the power loss occurring during operation into the heat sink. The two structures next to the ridge waveguide bear some of the mechanical load during assembly and in this way protect the ridge waveguide from excessive mechanical load. In addition, there are advantages for the dissipation of heat loss occurring during operation and easier horizontal orientation during assembly.

Hitherto, there has been a disadvantage in the production of semiconductor lasers with a three-legged structure in the additional costs for the production of the further structures, which has hitherto required an additional photolithography step. This was necessary to insulate the two structures on either side of the ridge waveguide from the contact to which the ridge waveguide is connected or to open a present flat passivation of the ridge waveguide and enable contacting. With the method described here, such an additional photolithography step is no longer necessary, leading to the ability to produce semiconductor laser devices particularly cost-efficiently.

According to at least one embodiment of the method, after performing the first plasma etching method and before performing the second plasma etching method, further method steps are performed. First in this case, a further mask can be applied on the top surface of the first layer facing away from the second layer. The further mask in this case can be applied after peeling off the mask. Furthermore, it is possible for the mask to remain on the top surface of the first layer and for the further mask to be applied in addition to the mask. The position of the further mask in this case is selected, for example, such that the position of the further mask is at most partially congruent with the position of the mask. It is possible here that the positions of the mask and of the further mask do not overlap at all or the positions of the two masks overlap partially.

In a further method step, the first plasma etching method is then performed again. In other words, the plasma etching method that comprises, e.g., approximately the same selectivity for the first layer and for the second layer is performed again for the further mask.

In other words, the first plasma etching method is applied to the sequence of layers multiple times and thus the first layer is interrupted multiple times by openings, and the second plasma etching method, with which the openings are then etched to form the trenches in the desired depth, is only affected afterwards. In this way, many trenches can be patterned in the very same sequence of layers below the resolution limit of photolithography. In this case, the particularly narrow trenches created in this way can lie close together or can overlap.

According to at least one embodiment of the method, the mask is removed before the further mask is applied. This is advantageous in particular when the trenches to be created are to overlap. Using the masks, it is possible, e.g., to create a lattice of trenches, along which the sequence of layers can later be singulated into individual chips, for instance by the second plasma etching method. In other words, the method can also be used for so-called "plasma dicing", in which the sequence of layers is divided into individual chips by narrow trenches by means of the described plasma etching methods. In this case, the trenches for singulation can turn out to be significantly narrower than was up to now the case and the number of components that can be produced from the sequence of layers thus increases advantageously. A method as described here can therefore also be performed particularly economically.

Using a method as described here, depending on the selection of the shape of the mask, narrow rings, rectangular frames or any other closed, narrow structures of any depth can be etched on circular or rectangular structures of the mask. The methods described here are distinguished by the fact that structures can be created of which the structure size is below the resolution limit of photolithography. Moreover, there is the possibility of saving photolithography steps, e.g., in the production of three-legged structures of semiconductor laser devices. The possibility of producing significantly narrower trenches than was up to now the case leads to significantly better surface utilization of the sequence of layers and thus the possibility of reducing costs in the production of, e.g., semiconductor laser devices or other semiconductor chips.

A semiconductor laser device is further provided. The semiconductor laser device can be produced using a method as described here. That is, all features disclosed for the method are also disclosed for the semiconductor laser device and vice versa.

According to at least one embodiment, the semiconductor laser sequence comprises a sequence of layers, which is formed using a semiconductor material. The sequence of layers comprises, for example, at least one first layer and one second layer, which are arranged one on top of the other.

According to at least one embodiment of the semiconductor laser device, the semiconductor laser device comprises at least two trenches in the sequence of layers, which laterally delimit a ridge waveguide. That is, the trenches extend, for example, along a longitudinal direction on a top surface of the semiconductor layer sequence and delimit a ridge waveguide on both sides.

According to at least one embodiment of the semiconductor laser device, each of the trenches is delimited on its side facing away from the ridge waveguide by an area of the sequence of layers that has a maximum height, measured from the lowest point of the trench, which is smaller than the height of the ridge waveguide. The maximum height of the sequence of layers can be, e.g., at least 50% of the maximum height of the ridge waveguide. For example, the maximum height of the sequence of layers is between 90% and at most 99% of the height of the ridge waveguide. In other words, the semiconductor laser device comprises a so-called three-legged structure, in which the ridge waveguide is delimited by structures in the sequence of layers, the areas on the side of each of the trenches facing away from the ridge waveguide. As a result of a production method as described here, in which the first layer is slightly thinned in its areas not covered by the mask during the first plasma etching method and optionally also during the second plasma etching method, the areas of the side of the trenches facing away from the ridge waveguide are configured somewhat thinner than the sequence of layers in the area of the ridge waveguide where the sequence of layers was covered by the mask. This difference in height can be utilized for adjustment in particular during assembly with the ridge waveguide on a heat sink, in which the heat sink has a slightly lowered area in the area of the ridge waveguide, so that the ridge waveguide and the areas on the side of the trenches facing away from the ridge waveguide each lie against the heat sink in contact therewith.

Such a semiconductor laser device can be produced using a reduced number of photolithography steps, and thus particularly cost-efficient, due to the method described here.

According to at least one embodiment of the semiconductor laser device, the device comprises a sequence of layers which is formed using a semiconductor material as well as two trenches in the sequence of layers, which trenches laterally delimit a ridge waveguide. Each of the trenches here is delimited on its side facing away from the ridge waveguide by an area of the sequence of layers which, measured at the lowest point of the trench, has a maximum height that corresponds to between at least 90% and at most 99% of the height of the ridge waveguide.

BRIEF DESCRIPTION OF THE DRAWINGS

The method described here and the semiconductor laser device described here are described in more detail below with reference to exemplary embodiments and the associated figures.

In conjunction with FIGS. 1, 2, 3A, 3B and 3C, a first exemplary embodiment of a method as described here is explained in more detail.

With reference to FIGS. 4A and 4B, a second exemplary embodiment of a method as described here is explained in more detail.

With reference to FIGS. 5A and 5B, a further exemplary embodiment of a method as described here is explained in more detail.

In conjunction with FIG. 6, a further exemplary embodiment of a method described here is explained in more detail.

Identical or similar elements or elements having the same effect are provided with the same reference numerals in the figures. The figures and the size ratios of the elements illustrated in the figures should not be considered as being to scale. Rather, for better illustration and/or better understanding the size of individual elements may be exaggerated.

DETAILED DESCRIPTION OF ILLUSTRATIVE EMBODIMENTS

FIGS. 1, 2, 3A, 3B, 3C show sectional illustrations to explain a first exemplary embodiment of a method as described here.

In the method step shown in conjunction with FIG. 1, first a sequence of layers 10 is provided. The sequence of layers 10 comprises at least one first layer 1 and at least one second layer 2. The first layer 1 is arranged on an upper surface of the second layer 2 and covers it completely. The top surface 1a of the first layer 1 facing away from the second layer is covered partially by a mask 20 in such a way that the mask 20 covers a part of the top surface 1a and exposes another part of the top surface.

The mask 20 can be formed here using, e.g., lacquer, a metal such as chromium, titanium or aluminum, a dielectric material such as silicon dioxide or silicon nitride, an oxide such as aluminum oxide, tin oxide or indium tin oxide or a semiconductor material.

The first layer 1 is, e.g., an epitaxially deposited semiconductor material, a lacquer, a metal, a dielectric material or an oxide. The materials for the second layer can be selected from the same classes of materials.

In conjunction with FIG. 2, a further method step is explained in which a first plasma etching method is performed. The first plasma etching method has the same etch rates for the first layer and the second layer within the limits of manufacturing tolerance. Because of the effect of trenching, at the lateral surface 10b of the mask 20, an opening forms which leads to a trench 4 during the course of the method, which trench penetrates the first layer completely and reaches the second layer 2. The trench 4 here is deeper the smaller the distance d from the lateral surface 10b of the mask. That is, with increasing distance from the lateral surface 10b of the mask 20, the first layer is etched less strongly. Far away from the mask 20, the first layer is removed evenly and has no trench 4. The part of the first layer 1 covered by the mask 20 exhibits no removal, so that it is slightly elevated compared with the remaining first layer 1.

In the next method step, illustrated in FIGS. 3A, 3B and 3C, a second plasma etching method is effected in which the etch rate for the second layer is high compared with the etch rate for the first layer. In this way, the trench 4 is deepened into the second layer and a regularly configured trench is formed which can in places exhibit, e.g., a rectangular cross-section. The maximum lateral extent L of the trench in a direction perpendicular to the lateral surface 10b of the mask 20 is small compared with the opening in the mask 20 and, for example, has a size of at most 800 nm, in particular at most 100 nm, for example, 50 nm or 30 nm, measured in each case, e.g., in the area of the transition from the first layer 1 to the second layer 2.

The depth of the trench can be determined by the time during which the second etching method is applied, as illustrated in conjunction with FIG. 3A: the longer the second etching method is applied, the deeper will be the trench that is formed.

In conjunction with FIG. 3B, an alternative way of adjusting the depth of the trench is described. Here, the sequence of layers 10 comprises a third layer 3, which is arranged on the bottom side of the second layer facing away from the first layer. The third layer 3 in this exemplary embodiment is a layer having the same material composition as the first layer 1 and therefore an etch rate that is low compared with the etch rate at which the second layer is removed during the second plasma etching method. In this way, an etch stop occurs at the third layer 3 after the second layer 2 has been penetrated completely.

In conjunction with FIG. 3C, a further example for fixing the depth of the trench 4 is described. In this exemplary embodiment, a third layer 3 is likewise present, having a material composition which is different from that of layer 2, but which can have the same material composition as the first layer or a different material composition. In this case, the stopping of the etching method is affected as a result of an endpoint detection at the transition from the second layer 2 to the third layer 3.

In conjunction with FIGS. 4A and 4B, a further exemplary embodiment of a method as described here is explained in more detail with reference to sectional illustrations. In this exemplary embodiment of the method, a semiconductor laser device having a ridge waveguide structure 30 is produced. To this end, the mask 20, which extends, e.g., along a straight line and serves to define the ridge waveguide 30, is arranged on the top surface 1a of the first layer 1. On both sides of the mask 20, trenches 4 are created using a method as described in conjunction with FIGS. 1 to 3C. That is, due to controlled trenching in the immediate vicinity of the mask 20, the trenches 4 are defined at the steeply descending lateral surfaces 10b thereof, which trenches serve to guide waves of laser radiation in the finished component.

On the side of the sequence of layers 10 of the trenches 4 facing away from the ridge waveguide 30, areas A are then present which are removed slightly more strongly compared with the area of the semiconductor layer sequence 10 in the area of the ridge waveguide 30. Measured from the lowest point of the bottom surface of the trench 4, the ridge waveguide 30 therefore has a height HS which is higher than the height HA of the areas A. For example, the height HA is between at least 0.9 and at most 0.99 of the height HS.

In this way, a semiconductor laser device with a three-legged structure is provided. Any additional photographic technology can be omitted in this case and the lateral extent L of the trenches perpendicular to the lateral surface 10b of the mask 20 is not bound to the resolution of photographic technology but the trench width can be freely adjusted in a range from, e.g., at least 40 nm up to the size of the openings of the mask layer by means of the process parameters.

The method described here is suitable, for example, and in particular for producing laser structures having ridge waveguides and three-legged structures. The mask 20 is used to etch deep trenches 4 next to the ridge waveguide 30, thus creating a three-legged structure, although the etching mask exclusively covers the ridge waveguide. That is, no further mask is needed for producing the areas A on the side of the trenches 4 facing away from the ridge waveguide 30. When the three-legged structure is subsequently passivated and the mask 20 peeled off, it is thus possible for only the ridge waveguide 30 to be connected to a p-contact, whereas the remaining structure is insulated from the p-contact.

In conjunction with FIGS. 5A and 5B, with reference to schematic top views, a further exemplary embodiment of a method as described here is explained in more detail. In this method, masks 20 are first applied on the top surface 1a of the sequence of layers 10, which in the present case, in the example of FIG. 5A, extend from the left-hand side to the right-hand side and are arranged parallel to one another. A first application of the first plasma etching method is effected to form trenches 4, in which the second layer 2 is exposed.

Removal of the masks 20 then is effected and further masks 50 are applied on the top surface 1a of the sequence of layers 10 in a direction perpendicular to the main direction of extent of the first masks 20. A second application of the first plasma etching method is effected, in which trenches 4 are created, which run perpendicular to the trenches created during the first application of the method and in which the second layer 2 is likewise exposed.

In the subsequent method step, FIG. 5B, an application of the second plasma etching method is effected in which the third layer 3, which is arranged on the bottom side of the second layer 2 facing away from the first layer 1, is exposed. Intersecting trenches are obtained with a width below the resolution of photolithography. Along these trenches, for example, a singulation into semiconductor chips can be affected in which, due to the low width of the trenches, the smallest possible amount of, e.g., epitaxially produced semiconductor material is removed by the singulation process.

In conjunction with FIG. 6, a further exemplary embodiment of a method as described here is explained in more detail. In this exemplary embodiment of the method, the second etching, i.e., the second plasma etching method, is performed only very briefly. This method can be performed when the etch depth into the second layer 2 should be only a few nanometers, e.g., to interrupt current paths or to create optically active structures. Optically active structures can be, e.g., so-called air gaps, i.e., air inclusions, which are formed in the present case by the trenches 4. To this end, the method described here is performed directly at the ridge waveguide 30 in order to create narrow trenches 4 next to the ridge waveguide 30, which do not close up in the subsequent passivation step but are overgrown. As a result of the large difference in refractive index between air and the surrounding material, the possibility arises of optimizing the laser emission by the semiconductor laser device thus produced in the near and far fields. Alternatively, it is possible that the structures thus created are superimposed with the passivation layer 40 and control of the near and far field optimization is affected via the refractive index of the passivation layer.

The description with reference to the exemplary embodiments does not limit the invention thereto. Rather, the invention comprises any new feature as well as any combination of features, which in particular includes any combination of features in the patent claims, even if this feature or this combination per se is not explicitly stated in the patent claims or exemplary embodiments.

The invention claimed is:

1. A method for patterning a sequence of layers comprising:
   providing the sequence of layers, wherein the sequence of layers comprises a first layer and a second layer, which differ from one another in terms of their material composition;
   applying a first mask on a top surface of the first layer facing away from the second layer;
   partially removing the first layer in an area of the sequence of layers not covered by the first mask and partially exposing the second layer by a first plasma etching method; and
   at least partially removing the exposed second layer by a second plasma etching method,
   wherein the first layer is removed faster or greater by the first plasma etching method with a diminishing distance in a direction lateral to the first mask,
   wherein the first layer is removed at a lower etch rate than the second layer during the second plasma etching method,
   wherein at least one trench is created in the sequence of layers, wherein the at least one trench extends completely through the first layer and only partly into the second layer, and wherein a bottom surface of the at least one trench is formed by a part of the second layer.

2. The method according to claim 1, wherein the first layer and the second layer are removed at etch rates that are very similar but not necessarily the same during the first plasma etching method.

3. The method according to claim 1, wherein the at least one trench directly borders the first mask laterally.

4. The method according to claim 1, wherein a lateral extent of the at least one trench perpendicular or transverse to a lateral surface of the first mask facing the trench is small compared with a lateral extent of an opening in the first mask.

5. The method according to claim 1, wherein a lateral extent of the at least one trench is less than 800 nm.

6. The method according to claim 1, wherein the sequence of layers comprises a third layer, wherein the third layer is arranged on a side of the second layer facing away from the first layer, and wherein the second layer and the third layer differ from one another in terms of their material composition.

7. The method according to claim 6, wherein the at least one trench extends directly at or into, or through the third layer.

8. The method according to claim 1, wherein the sequence of layers is formed using semiconductor material, wherein the first mask covers a ridge waveguide, and wherein, in each case, one of the trenches is created on opposite sides of the first mask in such a way that the trenches laterally delimit the ridge waveguide.

9. The method according to claim 8, wherein each of the trenches is delimited on its side facing away from the ridge waveguide by an area of the sequence of layers which, measured from a lowest point of the trench, has a maximum height which corresponds to between at least 90% and at most 99% of a maximum height of the ridge waveguide.

10. A method for patterning a sequence of layers comprising:
    providing the sequence of layers, wherein the sequence of layers comprises a first layer and a second layer, which differ from one another in terms of their material composition;
    applying a first mask on a top surface of the first layer facing away from the second layer;
    partially removing the first layer in an area of the sequence of layers not covered by the first mask and partially exposing the second layer by a first plasma etching method;
    at least partially removing the exposed second layer by a second plasma etching method; and
    after performing the first plasma etching method and before performing the second plasma etching method, applying a second mask on the top surface of the first layer facing away from the second layer, wherein a position of the second mask is at most partially congruent with a position of the first mask, wherein the first plasma etching method is performed again, wherein the first layer is removed faster or greater by the first plasma etching method with a diminishing distance in a direction lateral to the first mask, wherein the first layer is removed at a lower etch rate than the second layer during the second plasma etching method, wherein at least one trench is created in the sequence of layers, and wherein the at least one trench extends completely through the first layer and at least partially through the second layer.

11. The method according to claim 10, wherein the positions of the first mask and of the second mask partially overlap.

12. The method according to claim 10, wherein the first mask is removed before the second mask is applied.

* * * * *